United States Patent [19]

McGuckin et al.

[11] 4,247,615

[45] Jan. 27, 1981

[54] CONTINUOUS-TONE DYED DIAZO IMAGING PROCESS

[75] Inventors: Hugh G. McGuckin, Rochester; Hyman L. Cohen, Hilton, both of N.Y.

[73] Assignee: Eastman Kodak Company, Rochester, N.Y.

[21] Appl. No.: 127,664

[22] Filed: Mar. 6, 1980

Related U.S. Application Data

[60] Division of Ser. No. 874,970, Feb. 3, 1978, which is a continuation-in-part of Ser. No. 840,879, Oct. 11, 1977, abandoned.

[51] Int. Cl.³ .......................... G03C 1/58; G03C 1/52
[52] U.S. Cl. ..................................... 430/145; 430/146; 430/147; 430/175; 430/177; 430/179; 430/202; 430/371
[58] Field of Search ............... 430/145, 147, 146, 148, 430/175, 202, 238, 177, 179, 371; 8/2.5

[56] References Cited

U.S. PATENT DOCUMENTS

| | | | |
|---|---|---|---|
| 1,517,200 | 2/1924 | Donisthorpe | 101/464 |
| 1,643,529 | 9/1927 | Von Arx | 101/464 |
| 1,729,347 | 9/1929 | Kirschenbaum | 8/2.5 |
| 2,063,348 | 12/1936 | Seymour | 430/293 |
| 2,100,063 | 11/1937 | Zahn | 430/322 |
| 2,107,094 | 2/1938 | Townsend et al. | 101/149 |
| 2,635,535 | 4/1953 | Jennings | 101/149.1 |
| 2,667,415 | 1/1954 | Neugebauer et al. | 430/302 |
| 2,687,958 | 8/1954 | Neugebauer | 430/197 |
| 2,692,826 | 10/1954 | Neugebauer et al. | 430/302 |
| 2,887,376 | 5/1959 | Tupis | 430/286 |
| 2,931,296 | 4/1960 | Ryan et al. | 101/149.1 |
| 3,010,391 | 11/1961 | Buskes et al. | 101/149.2 |
| 3,173,787 | 3/1965 | Clement et al. | 430/271 |
| 3,598,586 | 8/1971 | Gaspar | 430/145 |
| 3,698,896 | 10/1972 | Abbot | 430/210 |
| 3,715,210 | 2/1973 | Watkinson et al. | 430/176 |
| 3,756,819 | 9/1973 | Sinclair et al. | 430/371 |
| 3,758,445 | 9/1973 | Cohen et al. | 525/327 |
| 3,859,096 | 1/1975 | Burness et al. | 430/213 |
| 3,898,088 | 8/1975 | Cohen et al. | 430/518 |
| 3,944,474 | 3/1976 | Cohen et al. | 204/87 |
| 4,131,466 | 12/1978 | Numura et al. | 430/294 |
| 4,132,553 | 1/1979 | Burkle et al. | 430/146 |

FOREIGN PATENT DOCUMENTS

| | | |
|---|---|---|
| 998278 | of 1976 | Canada. |
| 852483 | 10/1960 | United Kingdom. |
| 1161128 | 8/1969 | United Kingdom. |
| 1245952 | 9/1971 | United Kingdom. |
| 1277453 | 6/1972 | United Kingdom. |
| 1478036 | 6/1977 | United Kingdom. |

OTHER PUBLICATIONS

*Graphic Arts Monthly*, Mar., 1967, p. 74.

Primary Examiner—Edward C. Kimlin
Attorney, Agent, or Firm—D. M. Schmidt

[57] ABSTRACT

There is disclosed a composition and element, comprising a diazo resin and a mordant for anionic dyes that is compatible with the resin. The element of the invention is suitable for dye immersion and dye transfer to a mordanted receiver.

4 Claims, No Drawings

CONTINUOUS-TONE DYED DIAZO IMAGING PROCESS

RELATED APPLICATIONS

This is a division of application Ser. No. 874,970, filed Feb. 3, 1978, which is a continuation-in-part application of U.S. application Ser. No. 840,879 filed on Oct. 11, 1977, now abandoned.

BACKGROUND OF THE INVENTION (1) Field of the Invention

This invention relates to photohardenable imaging compositions and elements useful in the preparation of continuous-tone dye images, such as for color-proofing.

(2) State of the Prior Art

Previous color-proofing elements have contained a coating of a diazo resin in admixture with an inert polymeric binder to provide an anionic mordant which, with a cationic dye, forms a continuous-tone image. One example is illustrated in Canadian Pat. No. 998,278 issued to H. McGuckin, wherein the polymeric binder was hydroxyethyl cellulose. However, in such a system the binder of the coating remains intact as an integral layer even in the unexposed regions. This differs from more conventional systems of photohardenable diazo resins wherein the wash step removes the unexposed coating entirely. The latter system has been called a "wash-off" system to distinguish it from the wash-out systems such as are described in the above-noted Canadian patent.

In the past, wash-off diazo resins have had limited usefulness in color-proofing systems for a number of reasons. First, the speed of such resins by themselves has been somewhat slow. Second, the contrast resulting from the resin in a wash-off system has been such that a continuous-tone image has been difficult to produce therefrom. *Graphic Arts Monthly*, March, 1967, p. 74, notes, "At present, . . . there is no satisfactory means of proofing continuous-tone separation negatives. Presently available color films have too high a contrast for this use . . . ." Third, the only mordanting that can be achieved from a diazo resin is that of cationic or nonionic dyes, as is shown, for example, in the aforesaid Canadian patent. Much greater dye flexibility would be possible if an anionic dye system can be developed. Other light-sensitive materials have been used with anionic dyes, for example, diazo salts as described in the aforesaid Canadian patent, but diazo resins are preferred over the salts because the resins have a higher speed.

Still other examples exist of light-sensitive elements comprising a layer of light-sensitive polymer which, when photohardened, is used to mordant a dye, including anionic dyes, in the exposed areas remaining after a wash-off step. U.S. Pat. No. 2,887,376 issued to Tupis on May 19, 1959, illustrates examples of such elements, such as quaternized ammonium polymers or certain azido polymers dispersed in acrylate polymers. However, although such elements are highly useful, they do require a dispersion for coating and the use of elevated temperatures and alkaline solutions for the wash step, both of which tend to discourage the formation of continuous-tone imaging.

Continuous-tone color-proofing transfer systems featuring sender and receiver sheets have utilized the immobilization of dye in a colloidal system containing a light-sensitive azide, control of mobility being achieved by control of pH of the sender layer rather than by a mordant. An example of such a disclosure is U.S. Pat. No. 3,598,586 issued on Aug. 10, 1971, to Gaspar. However, pH control is less convenient than a system which internally and automatically fixes the dye.

Mordants of many kinds have been developed for the mordanting of both cationic and anionic dyes in a variety of binders. Patents illustrative of such mordants include U.S. Pat. Nos. 3,958,995 issued May 25, 1976, 3,756,819 issued on Sept. 4, 1973, 3,758,445 issued on Sept. 11, 1973, 2,635,535 issued on Apr. 21, 1953, 2,107,094 issued on Feb. 1, 1938, and 2,063,348 issued on Dec. 8, 1936, and British Pat. Specification Nos. 852,483 published Oct. 26, 1960, 1,245,952 published Sept. 15, 1971, 1,161,128 published Aug. 13, 1969, and 1,277,453 published June 14, 1972.

Patents relating to the background of dye transfer include U.S. Pat. Nos. 1,517,200 issued Nov. 25, 1924, 1,643,529 issued Sept. 27, 1927, and 2,931,296 issued Apr. 5, 1960.

Patents relating to the background of dyes utilized with lithographic light-sensitive materials in general, but not in conjunction with a mordant, include U.S. Pat. Nos. 2,667,415 issued Jan. 26, 1954, to Neugebauer et al, 2,687,958 issued Aug. 31, 1954, to Neugebauer, 3,692,826 issued Oct. 26, 1954, to Neugebauer et al, 3,010,391 issued Nov. 28, 1961, to Buskes et al, and 3,715,210 issued Feb. 6, 1973, to Watkinson et al. Of these, the Neugebauer U.S. Pat. No. 2,667,415 refers to anionic dyes but apparently only in conjunction with the treatment of the exposed foil or base rather than the light-sensitive diazo layer.

SUMMARY OF THE INVENTION

The present invention advantageously features a wash-off light-sensitive diazo resin composition and element comprising the same, and imaging processes suitable for continuous-tone imaging.

More specifically, there is provided a wash-off light-sensitive composition comprising, in admixture, as a photo-hardenable material, a light-sensitive diazo resin, and a mordant for an anionic dye, the mordant being compatible with the resin and capable of retention in the photohardened form of the composition.

Such a composition can be used to form a dye image by imagewise-exposing the composition in coated, layer form, developing the layer by rinsing it with water, and adding an anionic dye to the layer where it is immobilized by the mordant. The dye image further can be transferred to a receiver layer comprising a cationic mordant of a strength greater than that of the mordant of the composition mordant, by contacting the receiver layer to the composition layer in the presence of certain salt solutions or an alcohol-water mixture for a length of time sufficient to permit transfer of the dye from the composition mordant to the receiver mordant.

DESCRIPTION OF THE PREFERRED EMBODIMENTS

Although this invention is not limited to continuous-tone reproductions, and indeed is useful in reproducing halftone images, it is most remarkable in providing continuous-tone imaging. For example, continuous-tone imaging is useful in the field of pre-press color-proofing elements, a preferred embodiment stressed hereinafter, but it is also important in other possible uses of the composition and element of this invention, namely, graphic-arts print film, microfile print film, an intermediate or release print for video disc applications, an intermediate film for UV contact exposure and the like. The composition which makes this possible comprises a diazo resin and a mordant compatible with the resin, capable of attracting and retaining anionic dyes in the photohardened form of the composition. Suitable image-forming elements comprise the composition preferably coated on a support.

The composition is based upon the discovery that light-sensitive wash-off compositions thought to be unsuitable for continuous-tone imaging could be made to be so useful by the addition of mordants for anionic dyes as hereinafter described. Specifically, it was surprising to find that light-sensitive diazo resins could be so used.

Any water-soluble, light-sensitive diazo resin can be used. Particularly useful examples are low molecular weight resins having a recurring unit of the formula

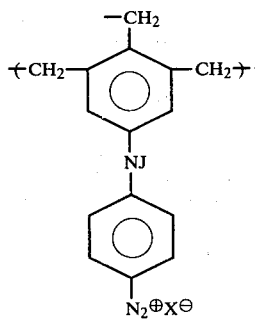

wherein J is $J^1$ or $J^2$ defined below, and $X^\ominus$ is an anion such as chloride and the like. Conventionally these are produced by the condensation of active carbonyl compounds, such as formaldehyde or paraformaldehyde, with a diazo compound of the general formula

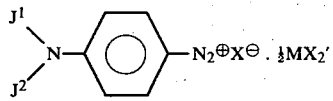

wherein:

X' is halide such as chloride;

M is a di- or trivalent metal of the group known to stabilize diazonium groups, e.g. cadmium zinc, bismuth, arsenic, antimony, tin, iron, platinum, mercury;

$X^\ominus$ is an anion or mixture of anions such as halides or sulfates;

$J^2$ may be a phenyl or substituted phenyl in which case the resin is an aldehyde condensation product of a p-diazodiphenylamine salt, and $J^1$ is hydrogen. $J^2$ and $J^1$ may also be organic radicals functionally capable of entering into an addition polymerization, polyesterification, condensation or other reaction capable of producing a resin. $J^1$ and $J^2$ in this case may be the same or different, the diazonium compound being a substituted p-diazo aniline.

Highly preferred resins are acid condensation products of a diazonium salt of p-aminodiphenylamine, such as diphenylamine-4-diazonium halide or diphenylamine-4-diazonium phosphate, condensed in acid with aldehydes such as paraformaldehyde or formaldehyde, and converted to a double metal salt, such as chlorozincate or fluoroborate. Such resins are conventional, the preparations and further details of which are described for example, by Kosar, *Light-Sensitive Systems,* pages 323–324 (1965), and by U.S. Pat. No. 3,235,384.

The effect of light upon light-sensitive diazo resins is well-known, and produces a negative-working resinous image; that is, a coating of such an imagewise-exposed resin crosslinks to form a water-insoluble polymer. The unexposed areas remain in the original, preferably water-soluble, form, and thus wash off when treated with an appropriate solvent.

To provide increased shelf life to the coating, it is conventional to add an acid preservative to the diazo resins described above. Conventional acids so used include phosphoric acid, citric acid, p-toluenesulfonic acid, methanesulfonic acid, benzenesulfonic acid and substituted derivatives thereof, 2-naphthalenesulfonic acid, and the like. Alternatively, if immediate use is contemplated, such acid stabilizers can be omitted. If an acid stabilizer is used, the amount can vary from between about 0.1 mg./dm.$^2$ (1.0 mg./ft.$^2$) and about 1.0 mg./dm.$^2$ (10.0 mg./ft.$^2$).

Cationic mordants admixed with the resin serve to mordant anionic dyes when an element formed from the imagewise-photohardened composition is dipped into an appropriate dye solution.

By careful choice of subtractive dye colors, complementary to the color of the color-separation negatives through which exposure of the composition was achieved, a color-proofing element can be obtained in the form of an overlay comprising three color-separation positives. The positives are derived from three elements prepared pursuant to the invention, and three such subtractive dye solutions, as is conventional. Because of the relatively low contrast of the image so formed, such color-proofing element is eminently suited for use with continuous-tone images. Should a correction of one or more of the color negatives be necessary as evidenced by the proof, a corrected negative can be prepared, a new proof sheet of the negative exposed and processed, and then the composite reproofed. It is thus necessary to prepare printing plates, to set up presses and actually to print reproductions until the correctness of the negatives has been verified.

Not all cationic mordants are capable of functioning effectively with the diazo resin. For example, some mordants are incompatible with the resin because they precipitate the resin out the solution, preventing the composition from being coated. Still others substantially eliminate the normal adhesion that photohardened diazo resin has to the support, or they prevent photohardening of the resin. Thus, the mordant must be a compatible mordant and, as used herein, a "compatible mordant" is one that does not interfere with the normal photohardening capability of diazo resin, whether it be interference with the solution properties necessary for coating, the adhesion properties of the photohardened resin, the photohardening process itself, or any other property of the resin relating to photohardening.

The mechanism of the interaction between compatible mordants and the diazo resin is not completely understood; that is, it is not clear whether photocrosslinking occurs only within the diazo resin, entrapping the mordant therein, or whether the mordant, if polymeric in form, crosslinks with the resin. In any case, the mordant must be one which, by whatever mechanism, is capable of being retained in the photohardened form of the composition, in addition to being compatible as hereinbefore defined.

Useful polymeric mordants include some of those which have previously been used in various photographic films, papers and other applications and which have a composition which contains repeating monomeric units containing charge-bearing cationic groups. Of course, it should be recognized that other polymeric materials having the above-described properties and chemical composition, but which have not heretofore been identified as useful photographic mordants in the photographic arts, can also be employed within the scope of the present invention.

Particularly useful polymeric mordant compositions which can be employed in the invention include materials having, in the polymer chain, monomeric units of Formula (I) below:

wherein:

D is hydrogen or a chemical group linked with Q;

Q represents a chemical bond(s) or a chemical group linking $M^{\oplus}$ to the vinyl carbon atom, for example, Q and D together can form an alkylene substituted maleimide ring with $M^{\oplus}$ bonded to the alkylene;

$M^{\oplus}$ represents a cationic group, preferably a quaternary ammonium or phosphonium group, and $X^{\ominus}$ represents an acid anion such as a halide ion, for example, chloride or bromide, nitrate, methosulfate, p-toluenesulfonate, etc.

In accord with certain especially useful embodiments of the invention, $M^{\oplus}$ represents a quaternary ammonium having the Formula II below:

wherein: each of $R^1$, $R^2$ and $R^3$, which may be the same or different, represents an aryl, an aralkyl or an alkaryl group having from 6 to less than about 20 carbon atoms or an alkyl group having from 1 to about 10 carbon atoms.

Preferbly, Q in Formula (I) represents a hydrocarbon group, such as an arylene, arylenealkylene, alkylenearylene, arylenebisalkylene, alkylenebisarylene, or acyloxy, carbamylalkylene, or arylene formamidoalkylene, or $M^+$ represents a heterocyclic ring of the structures

wherein T is hydrogen, aralkyl, alkyl from 1 to 5 carbon atoms, or the like;

or (b)

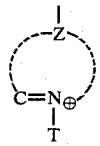

the number of non-metallic atoms necessary to complete a saturated or an unsaturated ring, and T is as defined above.

Typically, although not required, Q contains from about 5 to about 20 carbon atoms.

Particularly useful mordants are those having repeating units with the formula:

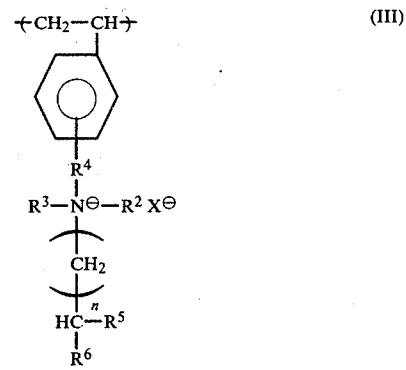

wherein:

$R^2$ and $R^3$ are as defined above;

$R^4$ is alkyl containing from 1 to about 3 carbon atoms;

n is 0, 1 or 2;

$R^5$ and $R^6$ are either both hydrogen or together form from one to about 5 carbon ring atoms, saturated, unsaturated or aromatic; and $X^{\ominus}$ is an acid anion.

The polymeric mordant compositions which have been found useful in the present invention can be homopolymers or copolymers, copolymers having been found to be particularly useful. A partial listing of representative copolymers includes polymeric mordant compositions containing recurring units having Formula (I) hereinabove and, in addition, up to about 75 weight percent of additional recurring units comprising the residue of noninterfering monomers. The term "noninterfering" monomers or repeating units is used herein to include chemical units which do not chemically or physically interfere with the above-described mordanting of anionic dyes. Monomer precursors which provide such noninterfering repeating units include aliphatic and aromatic hydrocarbons, such as olefins, substituted olefins, styrene and substituted styrenes; alkyl acrylates and methacrylates and derivatives thereof; and known equivalents for such monomer precursors. In addition, if desired, polymeric mordant compositions useful in the invention can be crosslinked so that individual polymeric chains are, for example, covalently crosslinked by difunctional crosslinking groups such as divinylbenzene and dimethacrylate, as well as a variety of other known equivalent difunctional crosslinking groups. Typically, if such difunctional crosslinking groups are present, they are contained in a polymeric mordant composition of the invention in the range of up to about 5 weight percent, preferably from about 0.1 to about 2 weight percent, based on the total weight of monomers present in the copolymerizable blend of monomers used to prepare such crosslinked polymer. Typically, representative copolymers useful as mordant compositions in the present invention are copolymerized from a monomeric blend containing (a) from about 25 to about 99 weight percent of monomer precursors for repeating units having Formula (I) above, (b) from about 1 to about 75 weight percent of monomer precursors for noninterfering repeating units and (c), if present, 0 to about 10 weight percent of a difunctional crosslinking agent.

Although certain preferred mordant compositions used in the present invention have been described immedidiately hereinabove as polymeric materials, it will be appreciated that, with appropriate adjustments, one can also use long-chain nonpolymeric materials having the requisite cationic group to mordant anionic dyes. When such monomeric mordant materials are employed in the present invention, it is preferred that they (a) possess a molecular configuration or a sufficiently high molecular weight and (b) include a vehicle known to crosslink with diazo resin, such as polyvinylpyrrolidone or polyvinylalcohol; such that the nonpolymeric mordant material is retained within the photohardened form of the composition. It is contemplated that monomeric mordants satisfying these criteria include those having a structure with Formula (IV) below:

$$\overset{R^7}{\underset{M^\oplus \; X^\ominus}{|}} \quad \text{(IV)}$$

wherein:

$M^\oplus$ and $X^\ominus$ are as defined above and $R^7$ is an organic moiety having molecular weight of 500 or larger.

A partial listing of individual representative polymeric mordant compositions useful in accord with the present invention includes the following materials, the ratios stated being molar ratios:

TABLE I

| Mordant No. | Name and Structure |
|---|---|
| M1 | Poly(styrene-co-3-maleimidopropyl-N,N-dimethyl-N-benzyl ammonium chloride) (1:1) 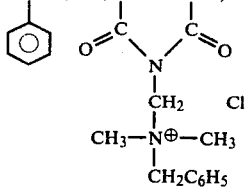 |
| M2 | Poly (N-vinylbenzyl-N,N-dimethyl-N-allylammonium chloride) 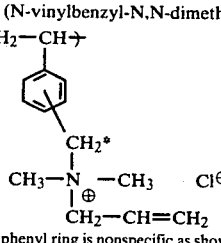 |

*The carbon bond to the phenyl ring is nonspecific as shown, because the monomeric mix can comprise both the meta and the para bonding positions; for example, it can be a mix comprising 55% by weight in the meta position and 45% by weight in the para position.

| | |
|---|---|
| M3 | Polyvinylimidazole** 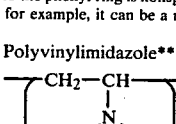 |

**This becomes cationic when one of the nitrogens of the imidazole group is protonated in an acid bath.

| | |
|---|---|
| M4 | Poly(N-vinylbenzyl-N,N-dimethyl-N-propargylammonium bromide) 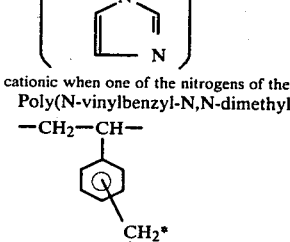 |
| M5 | Poly(styrene-co-N-vinylbenzyl-N,N-dimethyl-N-alkylammonium chloride) (1:1) 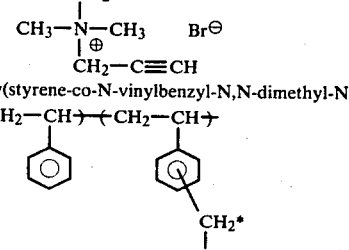 |

TABLE I-continued

| Mordant No. | Name and Structure |
|---|---|
| M6 | Poly(vinyl pyridinium acetate chloride) 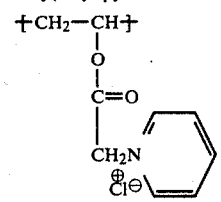 |
| M7 | Poly(N-vinylbenzyl-N,N-dimethyl-N-propylammonium bromide) 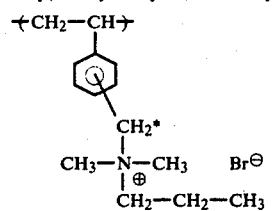 |
| M8 | Poly(N-vinylbenzyl-N,N,N-triethylammonium chloride) 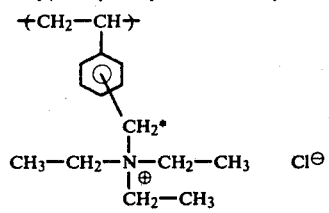 |
| M9 | Poly(N-vinylbenzyl-N,N-dimethyl-N-proparagylammonium chloride) 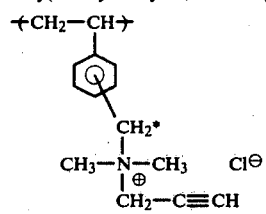 |
| M10 | Poly(N-vinylbenzyl-N,N,N-trimethylammonium chloride-co-ethylene glycol dimethacrylate) (93:7) 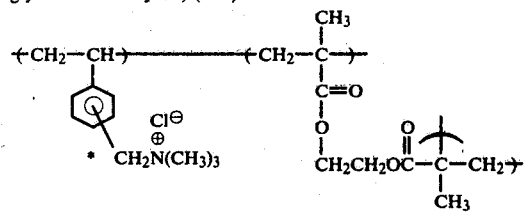 |
| M11 | Poly(N-vinylbenzyl-N,N-dimethyl-N-allylammonium bromide-co-divinylbenzene) (95:5) 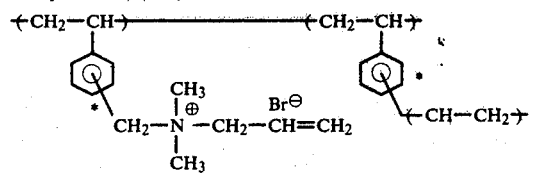 |
| M12 | Poly(styrene-co-N-vinylbenzyl-N,N-dimethyl-N-allylammonium bromide-co-divinylbenzene) (49:49:2) 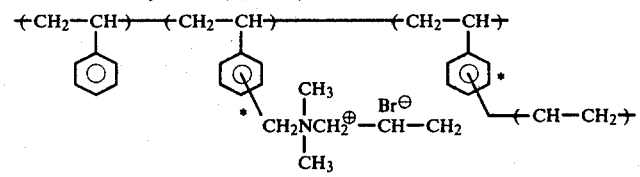 |
| M13 | Poly(N-vinylbenzyl-N,N-dimethyl-N-2-butenylammonium chloride) |

TABLE I-continued

| Mordant No. | Name and Structure |
|---|---|

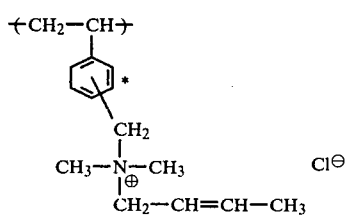

M14   Poly(styrene-co-N-vinylbenzyl-N,N-dimethyl-N-allylammonium chloride) (1:4)

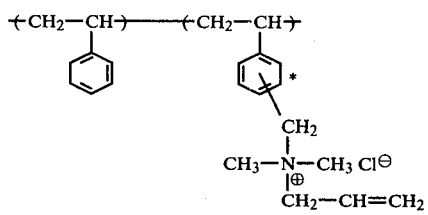

M15   Poly(styrene-co-N-vinylbenzyl-N,N,N-trimethylammonium chloride) (1:1)

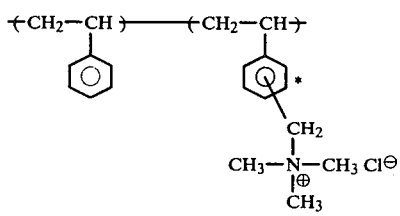

M16   Poly(styrene-co-N-acrylamidopropyl-N-benzyl-N,N-dimethylammonium chloride) (1:1)

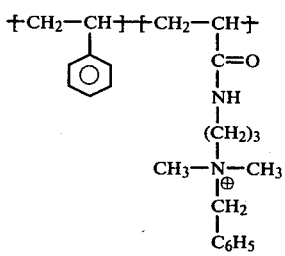

M17   Poly(N-vinylbenzyl-N-benzyl-N,N-dimethylammonium chloride)

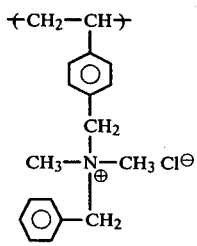

M18   Poly(styrene-co-N-vinylbenzyl-N,N-dimethyl-N-butylammonium chloride) (1:1)

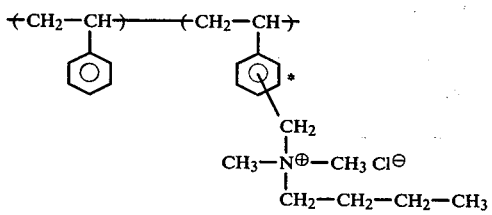

M19   Poly(vinylimidazole-co-1-vinyl-3-benzylimidazolium chloride) (1:1)

TABLE I-continued

| Mordant No. | Name and Structure |
|---|---|

[Structure: copolymer of vinylimidazole and N-benzyl vinylimidazolium chloride]

$$\text{--}(CH_2\text{--}CH)\text{--}(CH_2\text{--}CH\text{--})\text{--} \quad Cl^\ominus$$

M20   Poly[1-methyl-2-methyl-5-vinyl pyridinium-p-toluenesulfonate]

[Structure with $N^\oplus$—$CH_3$ $C_7H_7SO_3^\ominus$ and ring-$CH_3$]

M21   Poly[1-benzyl-4-vinyl pyridinium chloride]

[Structure: pyridinium with $N^\oplus$—$CH_2$—$C_6H_5$, $Cl^\ominus$]

M22   Poly[1-benzyl-2-methyl-5-vinyl pyridinium chloride]

[Structure with $N^\oplus$—$CH_2C_6H_5$, ring-$CH_3$, $Cl^\ominus$]

M23   Poly(N-vinylbenzyl-N,N-dimethyl-N-carbamylmethylammonium chloride)

[Structure: $CH_3$—$N^\oplus$—$CH_3$ with $CH_2C(O)$—$NH_2$, $Cl^\ominus$]

M24   Poly(N-vinylbenzyl-N,N-dimethyl-N-cyclohexylammonium chloride)

[Structure: $CH_3$—$N^\oplus$—$CH_3$ with cyclohexyl, $Cl^\ominus$]

M25   Poly[N-vinylbenzyl-N,N-dimethyl-N-(3-methyl-2-butenyl)ammonium chloride]

[Structure: $CH_2$—$N^\oplus(CH_3)_2$—$CH_2$—$CH=C(CH_3)_2$, $Cl^\ominus$]

M26   Poly(styrene-co-N-vinylbenzyl-N,N,N-trimethylammonium chloride) (1:2)

TABLE I-continued

| Mordant No. | Name and Structure |
|---|---|
| | 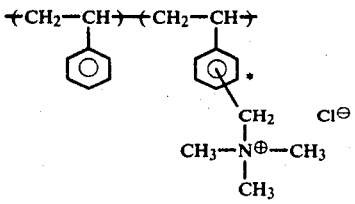 |
| M27 | Poly(N-vinylbenzyl-N,N-dimethyl-N-isobutylammonium chloride) 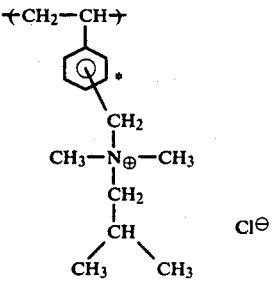 |
| M28 | Poly[N-(2-acrylamido-2,2-dimethylpropyl)-N,N-dimethyl-N-benzyl-ammonium chloride] 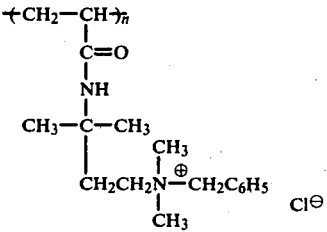 |
| M29 | Poly(N,N,N-trimethyl-N-vinylbenzylammonium chloride) 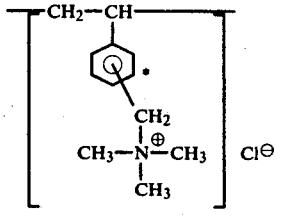 |
| M30 | Poly[styrene-co-benzyl(dimethyl)-p-vinyl-benzylammonium chloride] 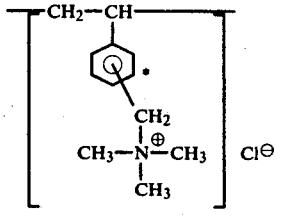 |
| M31 | Poly(N,N,N-trioctyl-N-vinylbenzylphosphonium chloride) 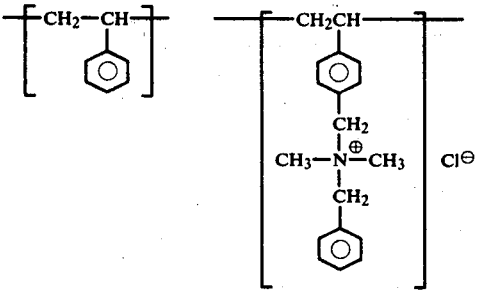 |
| M32 | Poly(styrene-co-N-vinylbenzyl-N,N,N-trihexylammonium chloride) |

TABLE I-continued

| Mordant No. | Name and Structure |
|---|---|

[structure: copolymer of styrene and vinylbenzyl-tri-n-hexylammonium chloride]

M33  Poly(N,N,N-trimethyl-N-vinylbenzylammonium chloride-co-stryene)

[structure: copolymer of styrene and vinylbenzyl-trimethylammonium chloride]

M34  Poly(styrene-co-N-vinylbenzyl-N,N-dimethylbenzylammonium chloride-co-divinylbenzene) (49:49:2)

[structure: terpolymer of styrene, N-vinylbenzyl-N,N-dimethylbenzylammonium chloride, and divinylbenzene]

M35  Poly(N-vinylbenzylpiperidinium chloride)

[structure]

M36  Poly(4-vinylphenylcarbamylmethyl-N,N,N-trimethylammonium chloride)

[structure]

M37  Poly(N-vinylbenzyl-N,N-dimethyl-N-acetonylammonium chloride)

[structure]

M38  Poly(N-vinylbenzyl-N,N-dimethyl-N-methoxycarbonylmethylammonium chloride)

[structure]

M39  Poly(N-vinylbenzylpyridinium chloride)

TABLE I-continued

| Mordant No. | Name and Structure |
|---|---|
| M40 | Poly(N-vinylbenzyl-N-methylpyrrolidinium chloride) |
| M41 | Poly(N-vinylbenzyl-N-methylpiperidinium chloride) |
| M42 | Poly(N-vinylbenzyl-N-methylmorpholinium chloride) |
| M43 | Poly(N-vinylbenzyl-N,N,-dimethylanilinium chloride) |

The mordant compositions useful in the present invention can be prepared by well-known chemical reaction techniques which have been extensively described in connection with the use of these same or similar materials in the photographic arts. Accordingly, a detailed description for preparing various mordant materials used in the present invention is unnecessary. However, if specific details for the preparation of such materials is desired, reference can be made to the following patents: British Pat. No. 1,261,925; U.S. Pat. Nos. 3,488,706; 3,557,066; 3,625,694; 3,709,690; 3,770,439; 3,758,445; 3,773,509; 3,859,096; 3,898,088; 3,944,424; and 3,958,995.

The relative amounts of mordant and diazo resin depend on the molecular weight and the mordanting strength of the mordant, as well as upon the desired end use. For mordants with higher molecular weight and greater mordanting strength, lower amounts can be used. Furthermore, because almost all diazo resins have a print-out stain or color, the amount of resin that is used depends in part upon the amount of desaturation that is permitted for a given end use.

For color-proofing use, a preferred range of diazo resin is from about 0.16 to about 1.0 mg./dm.$^2$ (1.5 to about 10 mg./ft.$^2$) of coating, and a preferred range of mordant is from about 0.5 to about 5.0 mg./dm.$^2$ (5 to about 50 mg./ft.$^2$). Highly preferred mordant amounts are from about 1.0 to about 1.5 mg./dm.$^2$ (10 to 15 mg./ft.$^2$).

Particularly in those instances wherein a coating of the composition of the invention is not self-supporting, a support is used on which the composition is coated. Any conventional photographic support can be used in the practice of this invention. Typical supports include transparent supports, such as film supports and glass supports, as well as opaque supports, such as metal and photographic paper supports. The support can be either rigid or flexible. The most common photographic supports for most applications are paper, including those with matte finishes, and transparent film supports, such as poly(ethylene terephthalate) film. Suitable exemplary supports are disclosed in *Product Licensing Index*, Vol. 92, December, 1971, Publication 9232, at page 108, published by Industrial Opportunities Limited, Homewell, Havant Hempshire PO91EF, United Kingdom. The support can incorporate one or more subbing layers for the purpose of altering its surface properties so as to enhance the adhesion of the radiation-sensitive coating to the support. Typically, the solution is coated out of water onto the support by such means as whirler coating, brushing, doctor-blade coating, hopper coating and the like. Thereafter, the solvent is evaporated. Other exemplary coating procedures are set forth in the *Product Licensing Index*, Vol. 92, December, 1971, publication 9232, at page 109, published by Industrial Opportunities Limited, Homewell, Havant Hampshire PO91EF, United Kingdom. Coating aids can be incorporated into the coating composition.

In certain instances, such as those in which more severe agitation of the element is to be used during dye addition, as described below, increased hardness may be desired. Such hardness can be obtained by including a vinyl polymer such as poly(vinyl pyrrolidone) either in the layer containing the diazo resin, or as an overcoat, as hereinafter described more fully in the examples.

An element prepared as described above is first imagewise-exposed and then developed, prior to being immersed in a dye bath containing an anionic dye. Any form of exposure to activating radiation to which the diazo resin is responsive can be used. Because such resins respond primarily to UV light, the light source preferably is rich in UV. Conventional light sources of such character are readily available, and can be used.

The useful exposure technique will depend upon the end result desired. For preparation of color-proofing overlays, conventional contact exposure is highly convenient.

Following exposure, development of the element is achieved by washing or rinsing off the unexposed portions of the coating. Only the portions which have been photohardened will remain, in proportion to the amount of light that has struck the resinous coating. In turn, the amount of mordant remaining is in direct proportion to the amount of light transmitted to the coating. The wash solution comprises ordinary tap water, and can be in the form of a soft spray or simply a stream as it comes from the faucet. Alternatively, the wash can be achieved by a mechanical rubbing with a material soaked in water. The length of time for the wash is not critical, useful times ranging from about 2 seconds to about 1 minute.

Thereafter, anionic dye is added to the developed element, and specifically to the photohardened mordant-resin coating where it is at least temporarily immobilized, by immersing the element in a suitable dye bath. Preferably, the bath is a water solution or an aqueous buffer solution of a dye of a type hereinafter described in detail. The length of time of the immersion and the temperature of the bath are not critical. Preferred times are from about 10 to about 100 seconds, in a temperature range of from about 10° to about 40° C. The element is then removed and optionally rinsed to remove excess dye, and dried with or without heat. The rinse step can be processed exactly as the development step with the same range of time. All water processing steps can have the same range of temperatures as noted above for the dye bath.

Any anionic dye can be used to form a visually appearing image in the element by imbibition. The dye chosen will, of course, depend upon the desired color and therefore upon the desired end use. For example, black dyes can be used for a black printer overlay. For color-separation positives in forming a composite color-proofing overlay, the so-called subtractive colors are selected: cyan, magenta and yellow. A highly preferred class, for use in this invention, of magenta dyes consists of those having a structure in accordance with Formula (V):

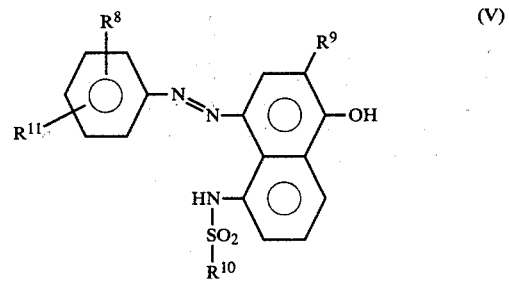

wherein
$R^8$ is an electron withdrawing group such as $SO_2CH_2CH_2CO_2H$, sulfamoyl, carboxyl, $SO_3H$, $SO_2CH_3$, alkyl of from 1 to 3 carbon atoms,

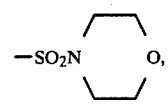

$-SO_2CH(CH_3)_2, -SO_2CF_3$ $R^9$ is an electron withdrawing group such as $SO_2CH_2CH_2CO_2H$, $SO_2NHCH_2CO_2H$, halogen, $SO_2NHO(CH_3)_3$, $SO_2NHCH_3$, $SO_2N(C_2H_5)_2$, $SO_2N(CH_3)_2$ or:

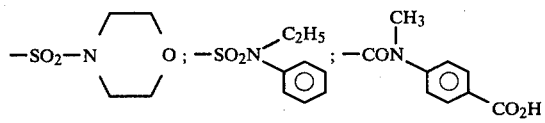

$R^{10}$ is an electron withdrawing group such as alkyl from 1 to 3 carbon atoms,

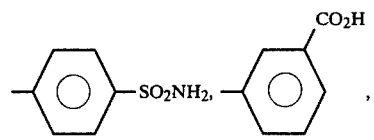

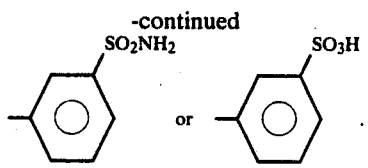

and R$^{11}$ is nitro, hydrogen, or halide.

A highly preferred class of cyan dyes is that in which R$^{11}$ is p-nitro and R$^8$, R$^9$, and R$^{10}$ are as described above.

In addition, Acid Fuchsin, Color Index 1740, is a useful magenta dye.

Highly useful yellow dyes are those having a structure in accordance with the following formulas (VI) or (VII):

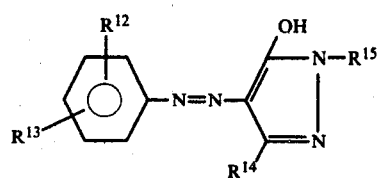
(VI)

wherein
R$^{12}$ is SO$_2$—NHCH$_2$CO$_2$H, SO$_3$H, SO$_2$NH$_2$, halogen, carboxyl, SO$_3$H, CONHCH$_2$CO$_2$H;
R$^{13}$ is alkoxy containing from 1 to 3 carbon atoms, hydrogen, halogen, or carboxyl;
R$^{14}$ is hydrogen; hydroxyy; alkyl containing from 1 to about 3 carbon atoms, such as methyl, ethyl, isopropyl, and the like; cyano; carboxyl; carbonamido; or carbamoyl; and
R$^{15}$ is:

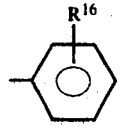

wherein
R$^{16}$ is SO$_3$H, CO$_2$H, chloride or hydrogen;

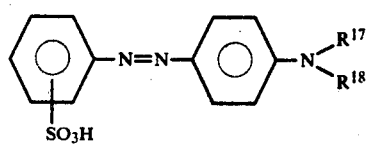
(VII)

wherein
R$^{17}$ is alkyl containing from 1 to about 3 carbon atoms and
R$^{18}$ is C$_2$H$_4$SO$_3$H, alkyl containing from 1 to about 3 carbon atoms, or C$_2$H$_4$NHSO$_2$CH$_3$;
as well as other dye structures.

The following Table II is a partial ist of representative useful examples of dyes falling within the above classes.

TABLE II

| Dye No. | Dyes Structure | Color |
|---------|---------|-------|
| D1 | (structure) | Cyan |
| D2 | (structure) | Cyan |

TABLE II-continued

Dyes

| Dye No. | Structure | Color |
|---|---|---|
| D3 | Naphthalene with OH, SO$_2$NHC(CH$_3$)$_3$, NH-SO$_2$-C$_6$H$_4$-SO$_2$NH$_2$, and N=N-C$_6$H$_3$(NO$_2$)(SO$_2$CH$_2$CH$_2$COOH) | Cyan |
| D4 | Naphthalene with OH, SO$_2$NH-t-butyl, NH-SO$_2$-C$_6$H$_4$-CO$_2$H, and N=N-C$_6$H$_3$(NO$_2$)(SO$_2$(CH$_2$)$_2$CO$_2$H) | Cyan |
| D5 | Naphthalene with OH, SO$_2$NHCH$_3$, NH-SO$_2$-C$_6$H$_4$-SO$_2$NH$_2$, and N=N-C$_6$H$_3$(NO$_2$)(SO$_2$CH$_2$CH$_2$CO$_2$H) | Cyan |
| D6 | Naphthalene with OH, SO$_2$-N-morpholino, NH-SO$_2$-C$_6$H$_4$-SO$_2$NH$_2$, and N=N-C$_6$H$_3$(NO$_2$)(SO$_2$(CH$_2$)$_2$CO$_2$H) | Cyan |

TABLE II-continued

Dyes

| Dye No. | Structure | Color |
|---|---|---|
| D7 | [Structure: 2-SO$_2$CH$_3$, 4-O$_2$N-phenyl-N=N-naphthol with Cl, OH, and NHSO$_2$-(3-SO$_3$H-phenyl) substituents] | Cyan |
| D8 | [Structure: 2-SO$_2$CH$_2$CH$_2$CO$_2$H, 4-O$_2$N-phenyl-N=N-naphthol with SO$_2$N(C$_2$H$_5$)$_2$, OH, and NHSO$_2$-(3-SO$_2$NH$_2$-phenyl) substituents] | Cyan |
| D9 | [Structure: 2-SO$_2$CH$_2$CH$_2$CO$_2$H, 4-O$_2$N-phenyl-N=N-naphthol with SO$_2$N(CH$_3$)$_2$, OH, and NHSO$_2$CH$_3$ substituents] | Cyan |
| D10 | [Structure: 4-H$_2$NSO$_2$-phenyl-N=N-naphthol with SO$_2$NHCH$_2$CO$_2$H, OH, and NHSO$_2$CH$_3$ substituents] | Magenta |
| D11 | [Structure: 3-HO$_2$C-phenyl-N=N-naphthol with SO$_2$NHC(CH$_3$)$_3$, OH, and NHSO$_2$CH$_3$ substituents] | Magenta |

TABLE II-continued
Dyes
| Dye No. | Structure | Color |
|---|---|---|
| D12 | 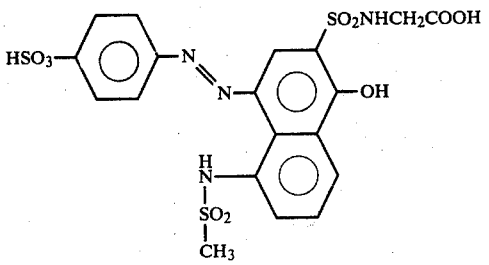 | Magenta |
| D13 | 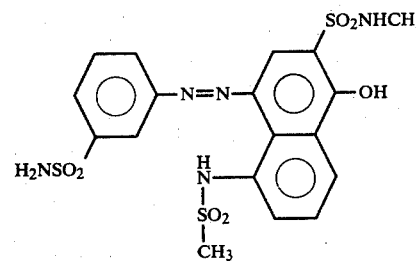 | Magenta |
| D14 | 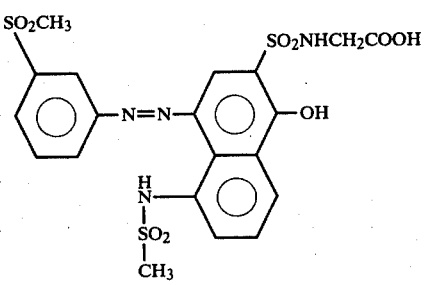 | Magenta |
| D15 | 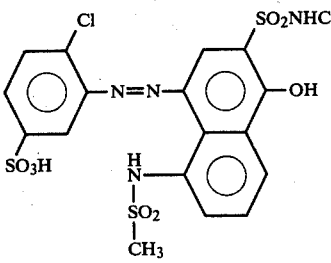 | Magenta |
| D16 | 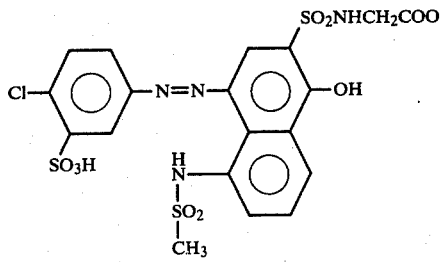 | Magenta |
| D17 | 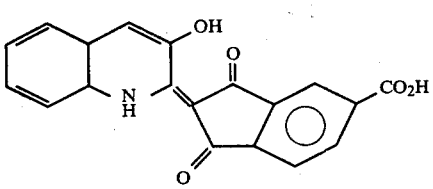 | Yellow |

TABLE II-continued

| Dye No. | Dyes Structure | Color |
|---|---|---|
| D18 | 4-HO3S-C6H4-N=N-C(=C(OH)-N(Ph)-N=C-CH3) (pyrazolone: 3-methyl-1-phenyl-4-(4-sulfophenylazo)-5-pyrazolone) | Yellow |
| D19 | 3-COOH-4-SO2NH2-C6H3-N=N-C(=C(OH)-N(Ph)-N=C-CN) | Yellow |
| D20 | 4-(HO2C-CH2-NH-SO2)-C6H4-N=N-C(=C(OH)-N(Ph)-N=C-CN) | Yellow |
| D21 | C6H5-N=N-C6H3(3-SO3H)... wait | Yellow |

(Structures are complex azo dyes; rendered descriptively below)

D18 — 4-(HO3S)C6H4—N=N—[4-hydroxy-3-methyl-1-phenylpyrazol-4-yl]; Yellow

D19 — 3-carboxy-4-sulfamoylphenyl—N=N—[4-hydroxy-3-cyano-1-phenylpyrazol-4-yl]; Yellow

D20 — 4-(HO2C-CH2-NH-SO2)C6H4—N=N—[4-hydroxy-3-cyano-1-phenylpyrazol-4-yl]; Yellow

D21 — 3-(HO3S)C6H4—N=N—C6H4—4-N(C2H5)(C2H4SO3H); Yellow

D22 — 3-(HO3S)C6H4—N=N—C6H4—4-N(CH3)2; Yellow

D23 — 4-(HO3S)C6H4—N=N—[5-hydroxy-1-phenylpyrazol-4-yl]; Yellow

D24 — 4-(HO3S)C6H4—N=N—[3,5-dihydroxy-1-phenylpyrazol-4-yl]; Yellow

D25 — 4-(H2N-SO2)C6H4—N=N—[5-hydroxy-1-(4-sulfophenyl)pyrazol-4-yl]; Yellow

D26 — 4-(HSO3)C6H4—N=N—[5-hydroxy-3-carbamoyl-1-phenylpyrazol-4-yl]; Yellow

TABLE II-continued

| Dye No. | Structure | Color |
|---|---|---|
| D27 | [structure: benzene-SO₃H — N=N — benzene — N(C₂H₅)(C₂H₄NHSO₂CH₃)] | Yellow |
| D28 | [structure: 3-chlorophenyl — N=N — pyrazolone (HO, CH₃) — N-phenyl-CO₂H] | |
| D29 | [structure: 3-carboxyphenyl — N=N — pyrazolone (OH, CH₃) — N-phenyl-COOH] | Yellow |
| D30 | [structure: HSO₃-phenyl-N(—C(=O)—)—C(CH₃)=CH—C=pyrazolone(OH, CH₃)—N-phenyl-SO₃H] | Yellow |
| D31 | [structure: tartrazine — HO₃S-phenyl-N—N=C(CO₂H)—C(=N—C₆H₄—SO₃H)—C(OH)] (tartrazine) | Yellow |
| D32 | [structure: 3-(SO₂NHCH₂COOH)phenyl — N=N — pyrazolone (OH, C≡N) — N-phenyl] | Yellow |
| D33 | [structure: (SO₃H)phenyl — N=N — naphthalene(OH, SO₂CH₂CH₂COOH, NHSO₂CH₃)] | Magenta |

These dyes can all be formed by conventional synthesis techniques.

The concentrations of the dye baths are not critical, and depend in part upon the extinction coefficient of the dye. Preferred concentrations range from about 0.1 percent to about 0.2 percent. As noted, the solvent is either water or water buffered to a pH suitable for the dye in question, such as an amount of potassium phosphate-sodium hydroxide sufficient to create a pH of about 8.0, used, for example, with some of the cyan, magenta or yellow dyes, or an acid to provide a pH of 5 if the mordant is M3, Table I.

The element so prepared can comprise the final image, particularly when three complementary separation positives are so formed on a transparent support as overlays, producing a color proof.

Transfer Process

Alternatively, the dye image can be transferred from the element described above, which functions as a sender layer, to a receiver element comprising preferably a support and a receiver layer on the support comprising a cationic mordant of a greater mordanting strength than that of the mordant of the sender layer. Such relative mordant strengths are easily determined by conventional competing mordant tests, such as those described in U.S. Pat. No. 3,958,995 issued on May 25, 1976. By transferring in proper registration to a single receiver element each of the cyan, magenta and yellow color-separation positives prepared as described above, a full-color proof can be obtained.

The receiver layer can comprise any of the polymeric mordants of Table I above, provided the one selected has a greater mordanting strength than the mordant of the sender layer. In addition, the receiver layer can include a binder, such as gelatin, or the binder can be omitted. Conventional hardening agents such as formaldehyde or bis(vinylsulfonyl methyl) ether can be used with the gelatin. The amounts of mordant and binder used for the receiver layer are not critical and can range, for the mordant, between about 5.0 mg/dm$^2$ (50 mg/ft$^2$) and about 50 mg/dm$^2$ (500 mg/ft$^2$) and, for the binder, between about 0 and about 60 mg/dm$^2$ (600 mg/ft$^2$). Greater mordant amounts can be used if the binder is omitted. Highly preferred are those receivers comprising about 10 mg/dm$^2$ to about 30 mg/dm$^2$ mordant and about 30 mg/dm$^2$ (300 mg/ft$^2$) to about 50 mg/dm$^2$ (500 mg/ft$^2$) of gelatin containing a formaldehyde hardener.

It is preferred that a support be used for the receiver layer if the layer is not self-supporting. Any of the supports described above for the sender layer can be used.

It has been ascertained that the transfer occurs best in a salt solution or alcohol-water mixture, and for this purpose either or both of the sender and receiver layers is presoaked in such a solution for a length of time which is not critical and can range from about 10 to about 100 seconds. Thereafter, the two layers are contacted together, as in a lamination, and pressed, such as by passing the layers through a stand of pressure rollers, for a length of time which can range from about 5 seconds to about 100 seconds, depending on relative mordant strengths. For mordants of extreme disparity or extreme similarity in strength, transfer times outside of this range may be appropriate. Thereafter, the two layers are separated.

Alternatively, the receiver layer can be manufactured with the transfer salt incorporated therein. A brief water soak of the sender layer is then used.

The salt solution selected for the transfer function depends primarily on the solubility of the mordanted dye. Highly preferred are the following: KX where X is halogen such as chloride, bromide and iodide sodium salicylate, and KCNS. Concentrations of these solutions can range from about 0.1 M to about 1.0 M, it being noted that KI or KBr will produce sharper images if used at lower concentrations within this range.

Alcohol-water solutions useful in the transfer process comprise mixtures wherein the alcohol is present in an amount equal to, or up to, 5 times the amount in volume of the water. Methanol, ethanol and isopropanol are representative examples of the alcohol component.

It is even possible, after such transfer, to redye the sender layer by reimmersing the original sender element in the same dye bath.

EXAMPLES

The following representative examples further illustrate the nature of the invention.

EXAMPLE 1

A coating was prepared on a 100-micron subbed polyester support which comprised Fairmont Diazo Resin No. 4, Type "L," a chlorozincate salt of the condensation product of formaldehyde and p-diazodiphenylamine supplied by Fairmont Chemical Co., 0.8 mg/dm$^2$, (7.5 mg/ft$^2$); phosphoric acid stabilizer, 0.2 mg/dm$^2$ (1.875 mg/ft$^2$); polymeric mordant poly(styrene-co-3maleimidopropyl-N,N-dimethyl-N-benzylammonium chloride) [50/50 mole percent], 3.5 mg/dm$^2$ (35.0 mg/ft$^2$); and Olin Surfactant 10G, a nonylphenoxypolyglycerol manufactured by Olin Chemical, 0.3 mg/dm$^2$ (3.0 mg/ft$^2$).

A sample of the above coating was contact-exposed to a 0.15 increment M-step tablet for 30 seconds, utilizing a Colight model M-99 mercury vapor source, manufactured by Colight, Incorporated of Minneapolis, Minnesota.

The sample was spray-washed with water for 10 seconds at 21° C., immersed in an aqueous solution of 0.4% Acid Fuchsin dye for 30 seconds and rinsed with water for 20 seconds at 21° C. A good density, continuous-tone magenta image was produced when the overlay was viewed by reflection on a sheet of print stock [D-max (green filter)=2.10, D-min (green filter=0.18, $\gamma$=2.40]. Excellent processing latitude was observed with a similar coating having a varied process (prewash, imbibition and postwash). For example, varying the time of imbibition from 15 to 90 seconds showed essentially no sensitometric differences. This was also the case when the temperature of the dye bath was varied from 16° to 32° C.

EXAMPLE 2

Samples of an overlay coating were prepared as in Example 1 except that the mordant was poly (N-vinylbenzyl-N,N-dimethyl-N-allylammonium chloride). After exposure to halftone red, green and blue separation negatives, they were processed under the conditions described in Example 1. The respective dye solutions employed were as follows:

| Cyan | French's Blue food dye | 0.15% in distilled water |
|---|---|---|
| Magenta | Fuchsin dye | 0.4% in distilled water |
| Yellow | 2-chloro-6-cyano-4-[4-(N-acetic acid) carbamoyl]phenylazophenol | 1.0% in pH 8.0 buffer (potassium phosphate-sodium hydroxide) |

Good density positives were obtained in each case.

A receiver element was prepared by coating the following formulation on a matte-surfaced polyethylene-coated paper support (both sides) comprising 21 mg/dm$^2$ (200 mg/ft$^2$) of the microgel mordant terpoly(-styrene:N-vinylbenzyl-N-benzyl-N,N-dimethylammonium chloride:divinylbenzene) (49.5:49.5:1) molar ratio (M35, Table I); 42 mg/dm$^2$ (400 mg/ft$^2$) of acid-processed pigskin gelatin; 0.4 mg/dm$^2$ (4.0 mg/ft$^2$) of formaldehyde hardener; and 0.7 mg/dm$^2$ (7.0 mg/ft$^2$) of Surfactant 10G. This receiver was presoaked by immersion in an 0.5 M aqueous solution of potassium chloride for 30 seconds at 21° C. and rolled in fact contact with the magenta overlay sample by means of soft-rubber pressure rollers. After 30 seconds contact at 21° C., the two materials were delaminated. A good-quality transfer image was observed in the receiver layer. After drying the receiver sample, the above procedures were repeated sequentially, utilizing the yellow and cyan overlay positives. Registration of the yellow image with the magenta transfer image was accomplished visually. One edge of the yellow overlay was taped while being held in register with the magenta transfer image. The taped overlay was then flipped back while the receiver was being presoaked. After transfer, the receiver was again dried and the procedure repeated with the cyan overlay. Upon completing image transfer from all three overlays, a goodquality, full-color reproduction of the original was observed.

EXAMPLES 3-28

The element and processing of Example 1 were repeated, except that the mordants used were M3 through M28 of Table I, respectively, along with 0.4 mg/dm$^2$ (3.75 mg/ft$^2$) of the acid stabilizer. In each case, the overlay that resulted produced a continuous-tone image having an acceptable density.

EXAMPLES 29-34

The ability to adjust the D-max of the overlay image by adjustment of mordant concentration was investigated. A mordant concentration series was coated using 3.5, 3.0, 2.5, 2.0, 1.5 and 1.0 mg/dm$^2$ of the allyl-substituted benzylammonium chloride mordant described in Example 2. The diazo resin and acid stabilizer were coated as described in Example 3.

A sample of each coating was exposed as described in Example 2, utilizing an aqueous 0.5% Acid Fuchsin dye solution. Table III lists the resulting maximum density for each mordant level.

TABLE III

| Example | Mordant Concentration (in mg/dm$^2$) | Maximum Density (Reflectin G$_r$) | Maximum Density (Transmission G$_r$) |
|---|---|---|---|
| 29 | (3.5) | — | 1.64 |
| 30 | (3.0) | — | 1.44 |
| 31 | (2.5) | 2.36 | 1.22 |
| 32 | (2.0) | 2.02 | 1.00 |
| 33 | (1.5) | 1.59 | 0.74 |
| 34 | (1.0) | 1.16 | 0.50 |

As the mordant level decreased, maximum density decreased. A plot of maximum density versus mordant concentration indicated a linear relationship. Based on this plot, an approximate level of 1.2 mg/dm$^2$ (12 mg/ft$^2$) of mordant would result in a useful reflection D-max of 1.30. A total speed loss of approximately 0.15 log E was noted between 3.5 and 1.0 mg/dm$^2$ (35 and 10 mg/ft) of mordant. Contrast and D-min remained fairly constant throughout the entire series.

EXAMPLE 35

A sample of an overlay coating was contact-exposed to a high-contrast halftone negative for 30 seconds, utilizing a Colight model M-99 mercury-vapor source. The particular coating contained Fairmount Diazo Resin No. 4, Type "L", phosphoric acid stabilizer and the polymeric mordant described in Example 1. This material was also processed exactly as described in Example 1.

A receiver material comprising 21 mg/dm$^2$ (212 mg/ft$^2$) of mordant poly(styrene-co-N-vinylbenzyl-N,N-dimethylbenzylammonium chloride-co-divinylbenzene), Table I, 21 mg/dm$^2$ (212 mg/ft$^2$) of gelatin and 0.2 (2.1 mg/ft$^2$) of bis(vinylsulfonylmethyl)ether hardener was presoaked for 30 seconds in distilled water at 21° C. and laminated in face contact with the processed overlay for 30 seconds at 21° C. by means of soft-rubber pressure rollers. A very low-density transfer image was observed (D-max 0.30). The above procedures were repeated except a methanol-distilled water mixture (3:1) was substituted as the transfer solution. As improved transfer density was obtained (D-max 0.68). This example demonstrated the efficiency in using an alcohol-water solution in the transfer step.

EXAMPLES 36-38

Potassium iodide, bromide and chloride were compared as transfer accelerators (i.e., compounds which, when added to the presoak bath, will increase the rate of dye transfer). Solutions of these salts (0.5 M) were used to presoak a reflection receiver, comprising 21 mg/dm$^2$ (200 mg/ft$^2$) of the receiver mordant of Example 35, 40 mg/dm$^2$ (400 mg/ft$^2$) of pigskin gelatin and 0.2 mg/dm$^2$ (2.4 mg/ft$^2$) of bis(vinylsunfonylmethyl)ether hardener coated on polyethylene-coated paper support. Each sample was presoaked for 30 seconds at 21° C., then laminated to a fully processed overlay sample for 30 seconds at 21° C. A receiver sample, presoaked in distilled water and laminated under these same conditions, was included as a control. The overlay samples prepared as in Example 1 were exposed and processed as described in Example 1. These samples were imaged with Acid Fuchsin dye (0.4% aqueous solution). Resulting maximum densities, along with an appraisal of halftone sharpness, are described in Table IV.

TABLE IV

| Example | Halide | Transfer D-max | Halftone Sharpness (Observed from Photomicrographs −55 Magnification) |
|---|---|---|---|
| — | none (control) | 0.38 | difficult to determine because of low density |
| 36 | 0.5M potassium chloride | 1.10 | good |
| 37 | 0.5M potassium bromide | 1.30 | fair |
| 38 | 0.5M potassium iodide | 1.66 | poor |

As indicated, maximum density readings tended to increase progressively, going from the control down to potassium iodide. However, image sharpness went in the reverse direction. The trend towards poorer image quality with increased dye transfer might be due to an increase in dye solubility, which in turn results in increased lateral dye diffusion. An unwashed sample of each transfer image was subjected to exposure under fluorescent light source (two 15-watt tubes at a distance of one foot). A severe yellow background stain was observed for the dye image transferred with potassium iodide. The images transferred with potassium bromide and chloride showed no indication of background staining. It is anticipated that a reduced concentration of KI (e.g., 0.25 M) would improve the sharpness to a level comparable to that of KBr.

EXAMPLE 39

An overlay coating was prepared as in Example 1, except that it contained the polymeric mordant poly(N-vinylbenzyl-N,N-dimethyl-N-cyclohexylammonium chloride) and 0.4 mg/dm$^2$ (3.75 mg/ft$^2$) of phosphoric acid. Exposure and processing occurred as in Example 1, the dye bath being buffered to a 8.0 pH with 6.81 g/l of potassium phosphate and 1.87 g/l of sodium hydroxide.

A sample of a receiver coating comprising 42 mg/dm$^2$ (400 mg/ft$^2$) of the receiver mordant of Example 35, 42 mg/dm$^2$ (400 mg/ft$^2$) of gelatin and 0.2 mg/dm$^2$ (2.4 mg/ft$^2$) of bis(vinylsulfonylmethyl)ether hardener was presoaked in a 1 M solution of KBr for 30 seconds at 21° C. The presoaked receiver was then rolled in face contact with the processed overlay for 30 seconds at 21° C. Upon separation of the two materials, a good-density dye-transfer image was observed.

EXAMPLE 40

A significant improvement in transfer density was obtained by utilizing potassium thiocyanate as the transfer salt. For example, a 0.5 M KCNS solution, when compared with a 0.5 M KBr solution, showed an approximate threefold increase in transfer density (2.55 vs. 0.79) from identically processed overlays containing the mordant poly(n-vinylbenzyl-N,N-cyclohexylammonium chloride described in Example 39. The receiver was presoaked for 30 seconds at 21° C. and contact made with the overlay for 30 seconds at 21° C. The receiver contained 42 mg/dm$^2$ (400 mg/ft$^2$) of the receiver mordant of Example 35, 42 mg/dm$^2$ (400 mg/ft$^2$) of gelatin and 0.2 mg/dm$^2$ (2.4 mg/ft$^2$) of bis(-vinylsulfonylmethyl)ether hardener. A similar density increase was obtained with the sodium salt of salicylic acid.

EXAMPLE 41

Andrew's Diazo Resin P1001-BF, a fluoroborate salt of the condensation product of formaldehyde and p-diazodiphenylamine was substituted into the overlay formulation of Example 39. This resin was found to be somewhat less water-soluble than the Fairmount resin of Example 1 (Type "L"), but was sufficiently water-soluble at the concentration required for coating. Good compatibility with the mordant and stabilizer were noted. Good coating uniformity was also noted. Sensitometrically, the Andrew's resin at an equivalent concentration showed slightly higher contrast and was 0.15 log E faster in speed than the Fairmount resin. There was very little difference in either D-max or D-min.

Exposure and processing were carried out as described in Example 2, using a 0.5% solution of Acid Fuchsin dye, and acceptable results were obtained.

EXAMPLE 42

An alternative transfer method was explored. Instead of presoaking the receiver in transfer solution for 30 seconds prior to lamination, the overlay was given a 5-second soak in distilled water and laminated with a receiver coating (on a poly(ethylene terephthalate) support) which contained the transfer salt. After 5 seconds' contact, the two materials were delaminated. Almost total transfer of dye was achieved.

This experiment was repeated with a receiver coating an polyethylene-coated paper under the same conditions. A good density transfer was obtained (D-max -1.52); however, there was noted a tendency for the receiver layer to tear apart upon delamination.

Incorporation of the transfer salt was accomplished by imbibing the receiver in a 0.5 M aqueous KCNS solution for 30 seconds, followed by drying.

Similar results were obtained by imbibing 0.5 M aqueous sodium salicylate solution into the receiver for 30 seconds.

EXAMPLE 43

To demonstrate an element having enhanced hardness, Example 24 was repeated by coating the support with the following formulation:

10.0 grams M24 Polymeric mordant
3.75 grams Fairmount #4 Type L diazo resin
1.5 grams 85% Phosphoric Acid
0.90 grams Surfactant 10 G, 50% solution
923 mls Distilled Water The solution was coated so as to provide 2.0 mg/dm$^2$ mordant and 0.75 mg/dm$^2$ diazo resin, dry coverages.

A second layer was overcoated over said first coating from the following solution formulation:

5 grams "PVP-K90" a polyvinylpyrrolidone (360,000 M.W.) sold by GAF Corporation
1.0 grams Surfactant 10 G
1000 ml Distilled Water The solution was coated so as to provide 1.0 mg/dm$^2$ PVP-K90. Exposure and development was achieved as in Example 1. Dye was applied by sponging it on, and it was noted that improved resistance to rubbing was demonstrated by the exposed coating.

EXAMPLE 44

Improved resistance to rubbing was also demonstrated when the poly(vinyl pyrrolidone) was incorporated into the first coating with the diazo resin.

Comparative Examples (C.E.)

C.E. No. 1: Unacceptable Mordants

An element was prepared and processed as described in Example 1, except that the mordant used was dimethyl-β-hydroxyethyl-γ-stearamidopropylammonium dihydrogen phosphate, a monomer wherein the R group attached to the quaternary ammonium had a molecular weight of 324, added to an equal amount of gelatin. Also, the dye solution was at 0.5% concentration. The result after dye imbibition was an unacceptably low density image.

C.E. Nos. 2 and 3: Diazo Resin Lacking Mordants

An element was prepared and processed as described in Example 1, except that no mordant was included in C.E. No. 2, and a paper support was used, subbed with hydrolyzed poly(vinyl acetate) cross-linked with hydrolyzed tetraethylorthosilicate pigmented with titanium dioxide. A second identical sample was prepared for C.E. No. 3. Both of these were exposed as in Example No. 1, and developed at 21° C. by a 10-second wash in distilled water, a 30-second immersion in a water bath (C.E. No. 2) or in a dye bath (C.E. No. 3), and a 20-second rinse. The dye bath was 0.4% tartrazine dye. After processing, both samples had the same gray-colored image, evidencing no mordanting of the anionic dye by the diazo resin alone.

C.E. No. 4: Relative Speeds, Cationic Dyes vs. Anionic Dyes

An element was prepared and processed as described in Example 1, except that no mordant was included in C.E. No. 4, and, as a control, an identical element containing 1.5 mg/dm² (15 mg/ft²) of the mordant of Example 19, Table I, was used. The cationic dye used for the comparative example was methylene blue, and the anionic dye used for the Control was D1, Table II, in an 8.0 pH buffer solution was described in Example 1. Without the mordant, C.E. No. 4 demonstrated a speed loss of 0.75 log E and a slight gain in contrast of about 1.0. (Gamma increased to 3.0 from 2.0).

Therefore, cationic dyes mordanted by the diazo resin itself as taught by conventional prior-art techniques cannot begin to provide the speed available from an element of the invention wherein a cationic mordant allows the use of an anionic dye.

C.E. No. 5: Relative Speeds, Diazo Resin vs. Diazo Salt

An overlay element was prepared by coating on a subbed 100-micron polyester support the following solutions to a wet coverage of 25-micron:

Part A $$\left[ C_2H_5-N(C_6H_4-N_2^{\oplus})-CH_2-CH_2-\overset{O}{\underset{\|}{C}}-O-CH=CH-CH=CH-C_6H_5 \right]_2 \quad ZnCl_4^{\ominus} \qquad 2.5\ g$$

| | |
|---|---|
| H₃PO₄ | 0.5 g |
| distilled water to make | 250 ml |

Part B

| | |
|---|---|
| Part A | 50 ml |
| 5.0% aqueous solution of poly[vinyl-benzyl) (dimethyl) (3-methylcrotyl) ammonium chloride | 25 ml |
| 5.0% aqueous solution of Type V pigskin gelatin | 25 ml |

After drying, this element required a contact exposure of 3 minutes, using the exposure and processing technique of Example 1, to obtain a good dye image. Such greatly increased exposure time demonstrated the slowness of this diazo salt compared with the typical exposure times of 30 seconds used with the diazo resins of the invention.

C.E. No. 6: Inoperative Polymeric Mordant

An element was prepared and processed as described in Example 1, except that the mordant used was poly[s-tyrene-co-vinylbenzyltrimethylammonium chloride] (2:1). Also, the dye solution was at 0.5% concentration.

C.E. No. 6 resulted in precipitation of the coating solution prior to coating, indicating that the mordant had rendered the diazo solution insoluble. This mordant was incompatible.

The invention has been described in detail with particular reference to certain preferred embodiments thereof, but it will be understood that variations and modifications can be effected within the spirit and scope of the invention.

What is claimed is:

1. A process for the formation of a dye image, comprising the steps of:
   (a) imagewise-exposing to activating radiation a layer comprising as a photo-hardenable material a light-sensitive diazo resin, and a mordant for an anionic dye, said mordant being compatible with and different from said resin and capable of retention in the photohardened form of the layer;
   (b) developing said layer by rinsing it with water to wash off unexposed portions; and
   (c) adding an anionic dye to said layer whereby said dye is immobilized by said mordant in the imagewise remaining exposed portions of said layer.

2. A process as defined in claim 1, wherein said mordant is protonated polyvinylimidazole.

3. A process as defined in claim 1, wherein said polymeric material includes a repeating unit having the formula:

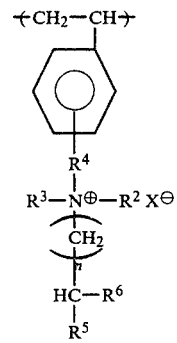

wherein R² and R³ are the same or different and are each aryl, aralkyl, or alkaryl having from 6 to less than about 20 carbon atoms, or alkyl containing from 1 to about 10 carbon atoms;

R⁴ is alkyl from 1 to about 3 carbon atoms;

n is 0, 1 or 2;

R⁵ and R⁶ are either both hydrogen or together form from one to about 5 carbon ring atoms, saturated, unsaturated, or aromatic; and X⁻ is an anion.

4. A process for the formation of a dye image in a receiver layer comprising a cationic first mordant of a predetermined mordanting strength; said process comprising the steps of:
   (a) imagewise-exposing a sender layer comprising: as a photo-hardenable material a light-sensitive diazo resin, and a second mordant for an anionic dye, said second mordant being compatible with and different from said resin and capable of retention in the photohardened form of the sender layer, said second mordant further having a lesser mordanting strength than said first mordant;
   (b) developing said sender layer by rinsing it with water to wash off unexposed portions;
   (c) adding an anionic dye to said sender layer, said dye being temporarily immobilized in the imagewise remaining exposed portions of said sender layer by said second mordant;
   (d) and imagewise-transferring said dye to said receiver layer by contacting said layers together in the presence of a salt solution or an alcohol-water mixture for a length of time sufficient to permit transfer of said dye from said second mordant to said first mordant.

* * * * *